(12) United States Patent
Peschiaroli et al.

(10) Patent No.: US 6,627,928 B2
(45) Date of Patent: Sep. 30, 2003

(54) METHOD OF MANUFACTURING AN INTEGRATED CIRCUIT, FOR INTEGRATING AN ELECTRICALLY PROGRAMMABLE, NON-VOLATILE MEMORY AND HIGH-PERFORMANCE LOGIC CIRCUITRY IN THE SAME SEMICONDUCTOR CHIP

(75) Inventors: Daniela Peschiaroli, Milan (IT); Alfonso Maurelli, Milan (IT); Elisabetta Palumbo, Milan (IT); Fausto Piazza, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/261,987

(22) Filed: Oct. 1, 2002

(65) Prior Publication Data

US 2003/0032244 A1 Feb. 13, 2003

Related U.S. Application Data

(62) Division of application No. 09/817,799, filed on Mar. 26, 2001, now Pat. No. 6,482,698.

(30) Foreign Application Priority Data

Mar. 29, 2000 (EP) .............................................. 00830236

(51) Int. Cl.⁷ ..................... H01L 29/76; H01L 29/94; H01L 31/062; H01L 31/113; H01L 31/119
(52) U.S. Cl. ...................................... 257/288; 257/549
(58) Field of Search ........................ 257/20, 27, 192, 257/213, 288, 295, 314, 315, 336, 337, 338, 339, 344, 376, 401, 408, 409, 545, 546, 547, 548, 549, 550, 595

(56) References Cited

U.S. PATENT DOCUMENTS

| | | | |
|---|---|---|---|
| 5,622,886 A | 4/1997 | Allum et al. | 438/238 |
| 5,668,034 A | 9/1997 | Sery et al. | 438/266 |
| 5,768,194 A | 6/1998 | Matsubara et al. | 365/185 |
| 5,861,347 A | 1/1999 | Maiti et al. | 148/117 |
| 5,908,311 A | 6/1999 | Chi et al. | 438/258 |
| 5,994,757 A | 11/1999 | Ichikawa et al. | 257/104 |
| 6,071,775 A | 6/2000 | Choi et al. | 438/231 |
| 6,125,059 A | 9/2000 | Hecht | 326/39 |
| 6,410,387 B1 * | 6/2002 | Cappelletti et al. | 438/257 |
| 6,482,698 B2 * | 11/2002 | Peschiaroli et al. | 438/257 |

OTHER PUBLICATIONS

Takeuchi et al. "A Self–Aligned STI Process Integration for Low Cost and Highly Reliable 1 Gbit Flash Memories" Symposium on VLSI Technology, US, New York, NY: IEEE, vol. CONF. 18, Jun. 9, 1998, pp. 102–103.

* cited by examiner

Primary Examiner—David Nhu
(74) Attorney, Agent, or Firm—Lisa K. Jorgenson; Allen, Dyer, Doppelt, Milbrath & Gilchrist, P.A.

(57) ABSTRACT

A method for manufacturing an integrated circuit having a memory device and a logic circuit includes forming a plurality of first transistors in a first portion of a semiconductor substrate, a plurality of second transistors in a second portion of the semiconductor substrate, and a plurality of memory cells in a third portion of the semiconductor substrate. A matrix mask used for selectively removing a dielectric layer from the first and third portions of the semiconductor substrate allows dielectric to remain on a floating gate of the plurality of memory cells and on the gate electrodes of the plurality of first transistors. A control gate is then formed on the floating gate, which is separated by the dielectric. Portions of the gate electrodes for the plurality of first transistors are left free so that contact is made with the transistors.

11 Claims, 9 Drawing Sheets

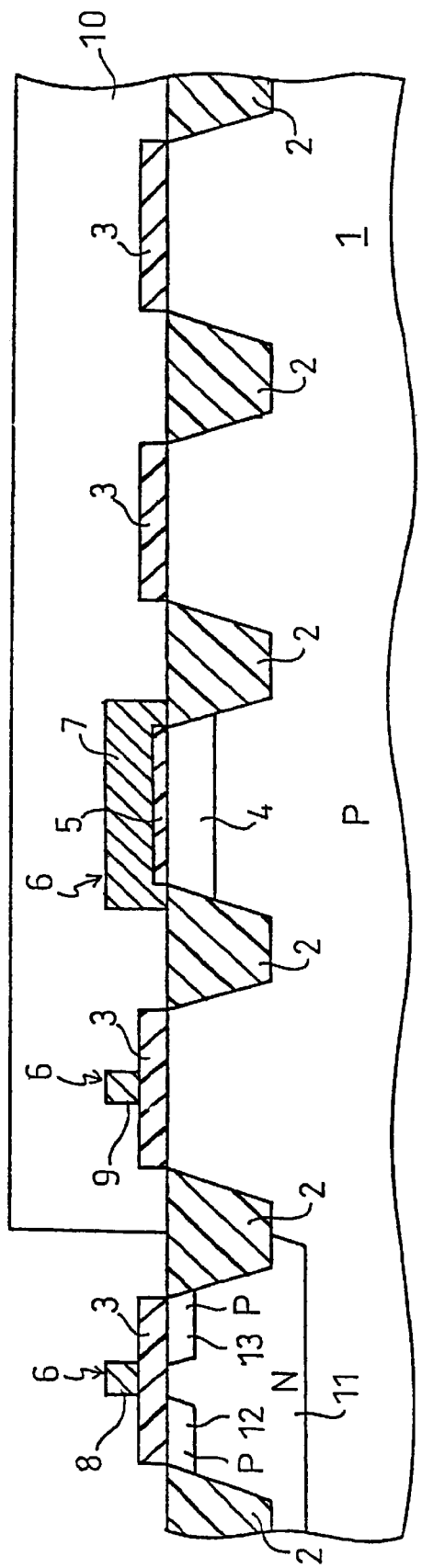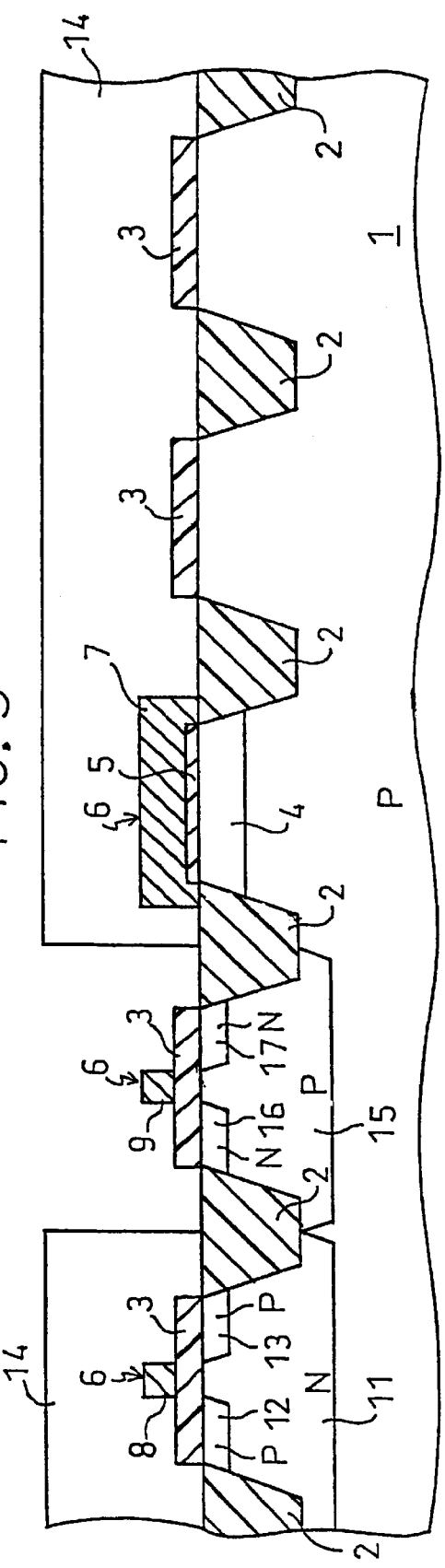

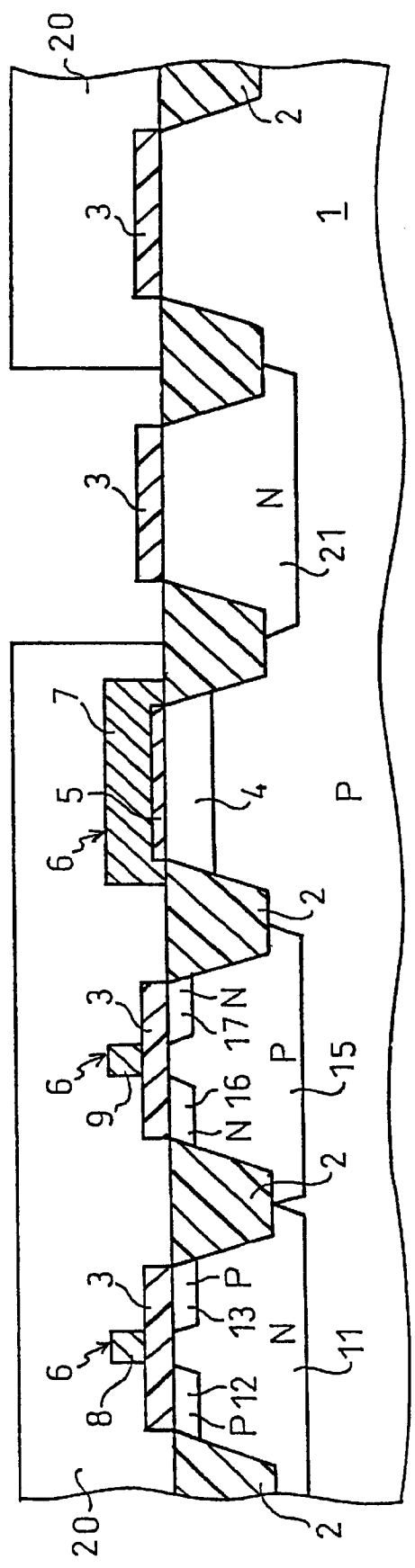
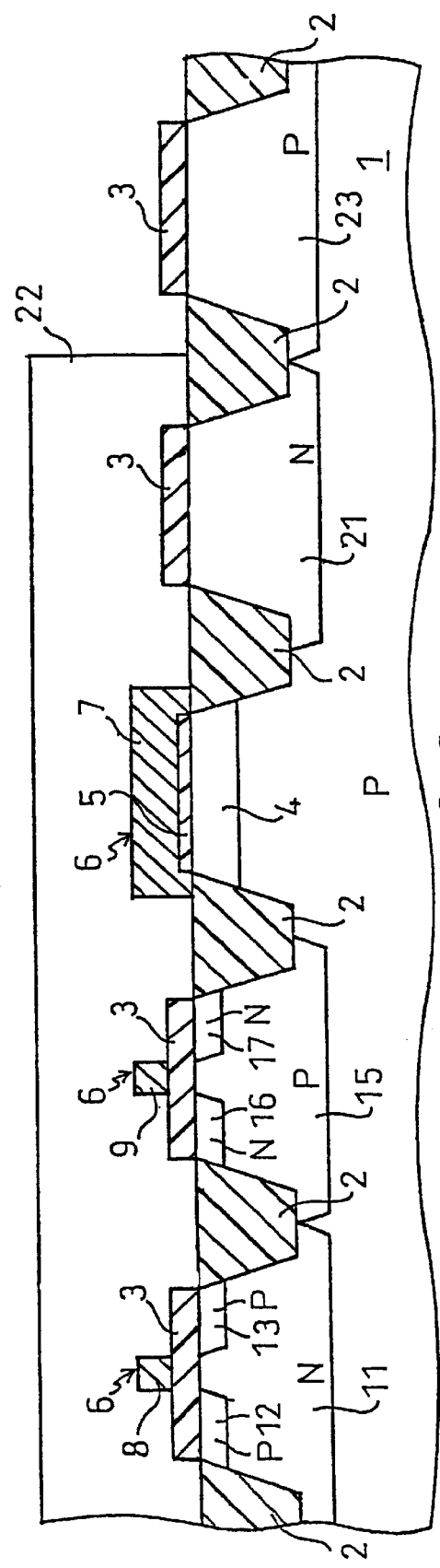
FIG. 7
FIG. 8

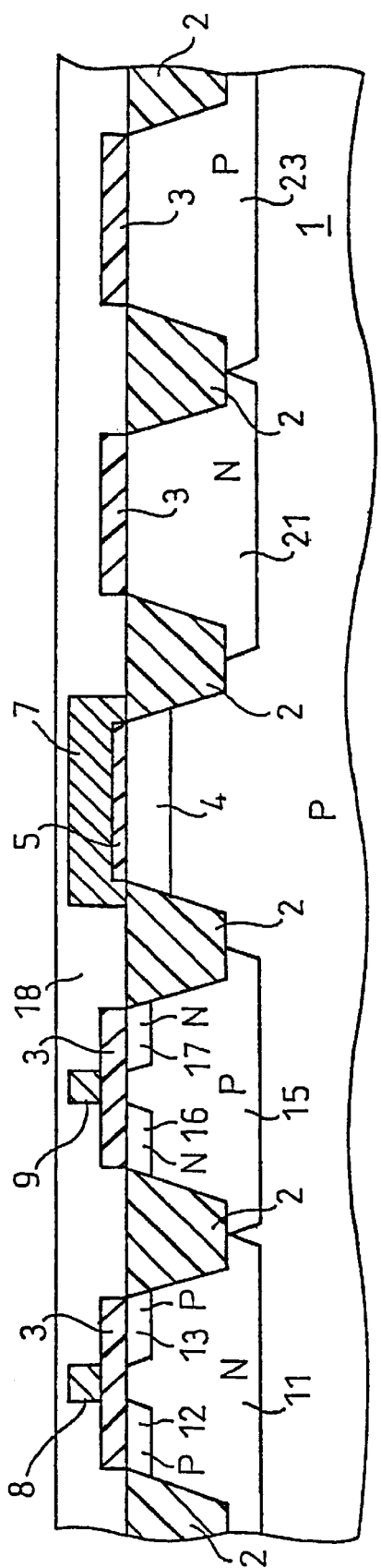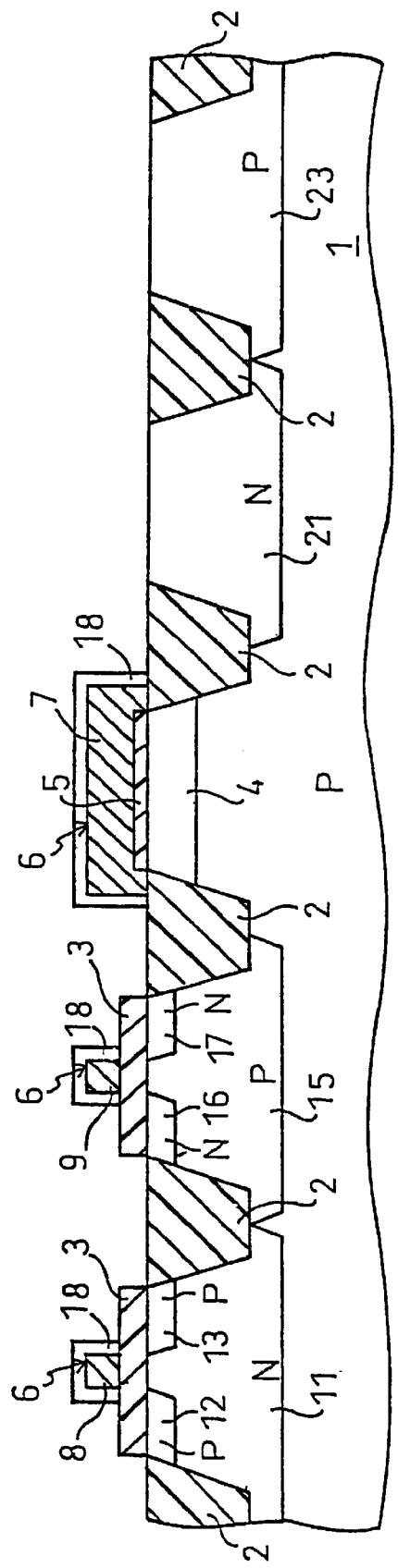

METHOD OF MANUFACTURING AN INTEGRATED CIRCUIT, FOR INTEGRATING AN ELECTRICALLY PROGRAMMABLE, NON-VOLATILE MEMORY AND HIGH-PERFORMANCE LOGIC CIRCUITRY IN THE SAME SEMICONDUCTOR CHIP

This application is a division of Ser. No. 09/817,799 filed Mar. 26, 2001, now U.S. Pat. No. 6,482,698.

FIELD OF THE INVENTION

The present invention relates in general to the manufacture of integrated circuits, and more particularly, to an electrically programmable, non-volatile memory and high-performance logic circuitry integrated in the same semiconductor chip.

BACKGROUND OF THE INVENTION

The development of integration techniques, which is directed towards the production of entire electronic systems or subsystems in a single semiconductor chip, involves the ability to integrate logic circuitry with memories having a high degree of complexity. In particular, there is an increasing need to integrate non-volatile memories, particularly of the electrically-programmable and erasable type, such as flash EEPROMs, in CMOS processes for the manufacture of high-performance logic circuitry, i.e., high-speed and low-consumption circuitry.

However, a combination of this type is becoming more and more difficult to achieve from a technological point of view because of the ever more different requirements, particularly in terms of operating voltages. In fact, on the one hand, the natural development of CMOS processes for high-performance logic circuitry leads to a progressive reduction in the operating voltage to enable the dimensions of the transistors to be reduced. The reduction in dimensions and in the operating voltage leads to a corresponding reduction in the thickness of the gate oxide and in the depth of the transistor junctions. On the other hand, electrically programmable, non-volatile memories require relatively high programming voltages, and in spite of the reduction in the dimensions of the memory cells, it is not considered possible to reduce these voltage values significantly in the near future, at least as far as floating-gate non-volatile memories are concerned.

With reference, for example, to 0.25 $\mu$m technology, the transistors produced by an advanced CMOS manufacturing process designed for high-performance logic circuitry are optimized for operating within a supply-voltage range from about 0.9 to 2.5 V. These transistors have gate oxides about 5 nm thick and source/drain junctions which can withstand a voltage no greater than about 8 to 10 V.

A flash EEPROM memory, on the other hand, requires a programming voltage within the range of 10 to 12 V for the programming of the memory cells. The programming voltage is even higher for other types of non-volatile memories. To be able to withstand these voltages, the transistors require gate oxides with a thickness within the range of 15 to 18 nm and source/drain junctions with breakdown voltages at least greater than the programming voltage.

It is not easy to reconcile these conflicting requirements. On the one hand, any attempt to modify the structure of the transistors within an advanced CMOS process to render them capable of withstanding the relatively high voltages required by non-volatile memories gives rise to an unacceptable reduction in the performance of the logic circuitry. On the other hand, complete duplication of the peripheral structures to produce both high-performance CMOS transistors and transistors which can withstand relatively high voltages greatly increases the number of photolithographic masks of the manufacturing process.

A method of manufacturing relatively high-density flash EEPROM memories, i.e., greater than 256 to 512 Kbits, requires two polysilicon levels. A lower level (the first poly) is used to form the floating gates of the memory cells, and an upper level (the second poly) is used to form both the control gates of the memory cells and the gates of the transistors of the memory service circuits, e.g., cell-selection, reading, and programming circuits. This method also requires at least two different gate oxide layers. One layer about 10 nm thick is formed between the surface of the substrate and the lower polysilicon level and acts as a gate oxide for the memory cells. The other layer, which is about 15 nm thick, is formed between the substrate and the upper polysilicon level and forms the gate oxide of the transistors of the service circuits.

In some methods of manufacture, to improve the performance of the memory at low supply voltages, transistors with a thin gate oxide layer (7 to 10 nm) are also provided. These transistors have gate electrodes formed from the second polysilicon level. However, in order to minimize the number of additional masks required, these transistors with thin gate oxides share many structural elements with the transistors with thicker gate oxides which control the relatively high voltages required, for example, for programming the memory cells.

When a non-volatile memory, for example, a flash EEPROM, is to be integrated by advanced CMOS manufacturing processes, the characteristics of the high-performance transistors must be preserved. In order to achieve this, the high-performance transistors cannot share structural elements with the transistors which control the relatively high voltages required by the memory cells. It is not enough to provide for the formation of two different gate oxide layers, and one or two additional masks for adjusting the threshold voltages. Additional masks would in fact be required to produce high-voltage junctions for the high-voltage transistors, and the number of additional masks could therefore easily become excessive.

SUMMARY OF THE INVENTION

In view of the prior art described above, an object of the present invention is to provide a readily manufactured integrated circuit including a non-volatile memory and high-performance logic circuit in the same semiconductor chip.

This and other objects, features and advantages in accordance with the present invention are provided by an integrated circuit comprising a semiconductor substrate, and a logic circuit on the semiconductor substrate. The logic circuit may comprise a plurality of first transistors on first portions of the semiconductor substrate operating at a first voltage, and each first transistor comprising a first gate oxide layer, a gate electrode on the first gate oxide layer, a first portion of a first dielectric layer covering the gate electrode, and a conducting layer covering the first dielectric layer. The logic circuit may also include a plurality of second transistors on second portions of the semiconductor substrate operating at a second voltage less than the first voltage, and each second transistor comprising a third gate oxide layer, and a gate electrode on the third gate oxide layer. The integrated circuit may also include a memory device on the semiconductor substrate. The memory circuit may comprise a plurality of memory cells on third portions of the semiconductor substrate, and each cell may comprise a second gate oxide layer, a floating gate on the second gate oxide layer, a second portion of the first dielectric layer on the floating gate, and a control gate on the second portion of the first dielectric layer.

The first gate oxide may have a first thickness, the second gate oxide has a second thickness, and the third gate oxide may have a third thickness less than the first thickness. For example, the first gate oxide layer may have a thickness in a range of about 100 to 300 angstroms, the second gate oxide layer may have a thickness in a range of about of about 70 to 110 angstroms, and the third gate oxide layer may have a thickness in a range of about 20 to 80 angstroms.

The memory device may comprise an EEPROM device, for example, and the logic device may comprise a CMOS logic device, for example. The plurality of first transistors may comprise at least one N-channel transistor and at least one P-channel transistor, and the plurality of second transistors may comprise at least one N-channel transistor and at least one P-channel transistor.

BRIEF DESCRIPTION OF THE DRAWINGS

The characteristics and the advantages of the present invention will become clear from the following detailed description of a preferred embodiment thereof, provided purely by way of a non-limiting example, with the aid of the appended drawings, in which:

FIGS. 1 to 14 are cross-sectional views showing the main stages for manufacturing an integrated circuit according to the present invention;

DETAILED DESCRIPTION OF THE PREFERRED EMBODIMENTS

Figure 1:
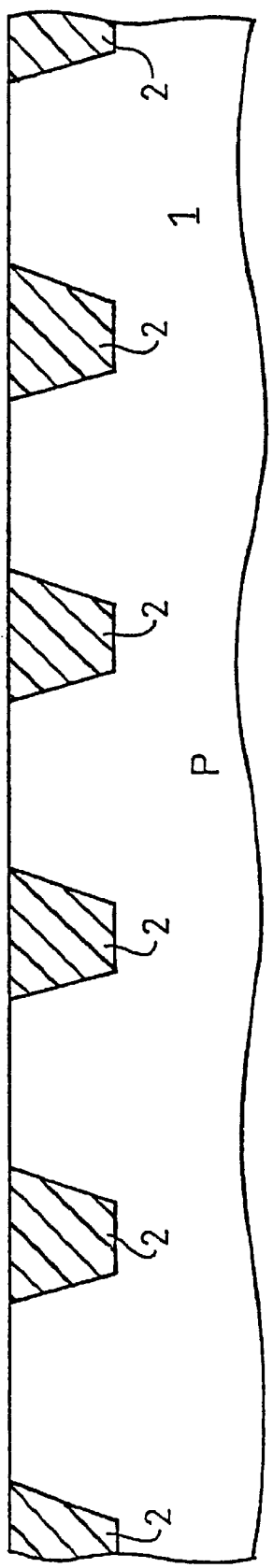

With reference to the drawings, and in particular to FIG. 1, thick silicon oxide insulation regions 2 are formed on the substrate 1 of semiconductor material, which is typically P-type monocrystalline silicon. The insulation regions 2 may be produced, for example, by the formation of surface trenches in the substrate 1, which are then filled with silicon oxide.

If desired, a dopant may be implanted selectively in the substrate 1 at this point by a specific photolithographic mask to form buried wells or tubs, which are typically provided for biasing the bodies of the memory cells independently of the biasing of the substrate 1.

A layer 300 of silicon oxide is then formed on the surface of the substrate 1. The oxide layer 300 preferably has a thickness of about 100 to 200 angstroms and will contribute to the formation of the gate oxide of the high-voltage transistors. That is, the transistors which will control the relatively high voltages required by the memory cells, for example, for the programming thereof. After the oxide layer 300 has been formed, a photolithographic mask is applied to the surface of the substrate and a P-type dopant, typically boron, is implanted selectively in the region of the substrate 1 in which the memory cells are to be formed, with a dose of $1 \times 10^{12}$ to $1 \times 10^{13}$ atoms/cm$^2$. This dopant implantation is useful for adjusting the threshold voltages of the memory cells.

Figure 2:
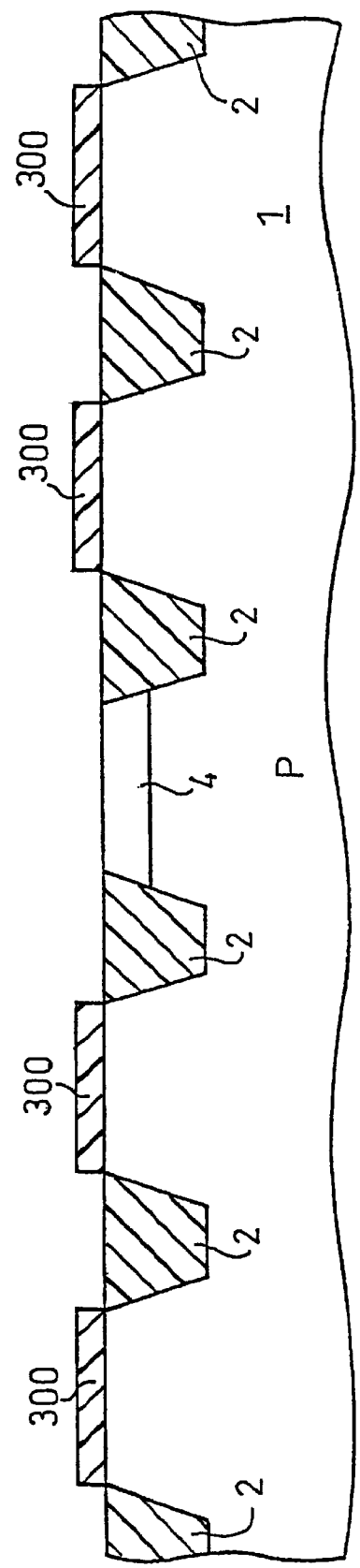

With the use of the same photolithographic mask, the oxide layer 300 is selectively removed from the region of the substrate 1 in which the memory cells are to be formed. After these steps, the structure is that shown in FIG. 2. A region 4 of the substrate 1 into which the dopant for the adjustment of the threshold voltages of the cells has been introduced is shown, and from the surface of which the oxide layer 300 has been removed.

Figure 3:
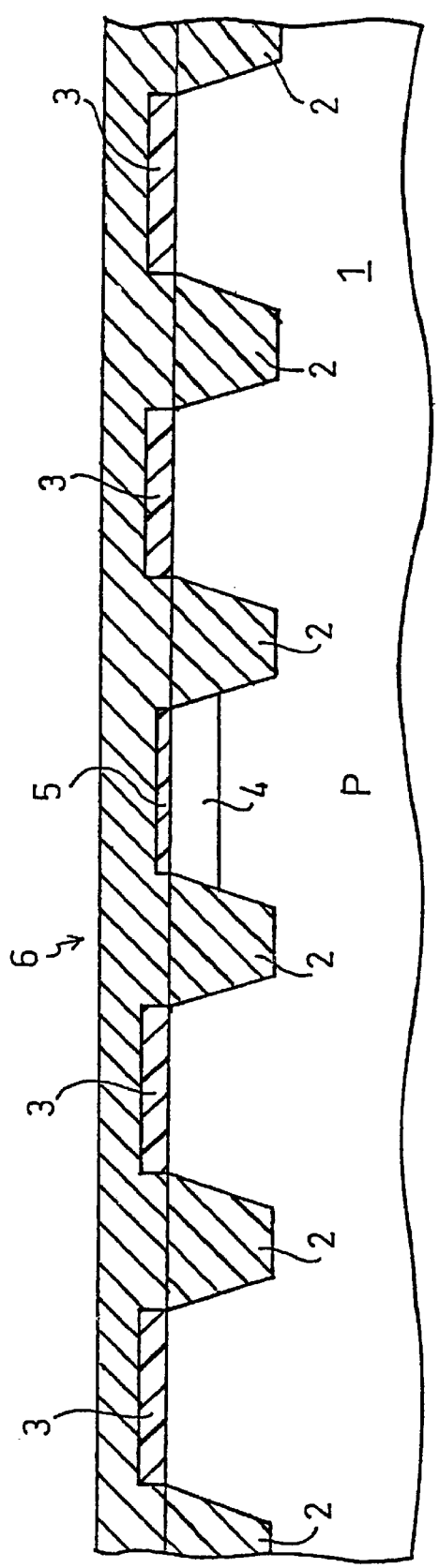

A silicon oxide layer 5 thinner than the oxide layer 300 is then formed on the region 4, as shown in FIG. 3. The oxide layer 5, which has a typical thickness of about 70 to 100 angstroms will act as gate oxide for the memory cell, or as a tunnel oxide in the particular case of an EEPROM or flash EEPROM memory. The oxide layer 5 and the oxide layer 300 complete the formation of the gate oxide for the high-voltage transistors and has a composite thickness equal to the sum of the thicknesses of the two oxide layers 300 and 5. This provides an overall thickness of about 100 to 300 angstroms. In the drawings, the oxide layer 3 is shown as a single layer, for simplicity. The oxide layer 5 is also superimposed on the layer 300 to form a composite layer 3 on the regions of the substrate which are to house the low-voltage transistors. This, however, is not important since this layer 3 will then be completely removed from these regions, as discussed below.

Figure 4:
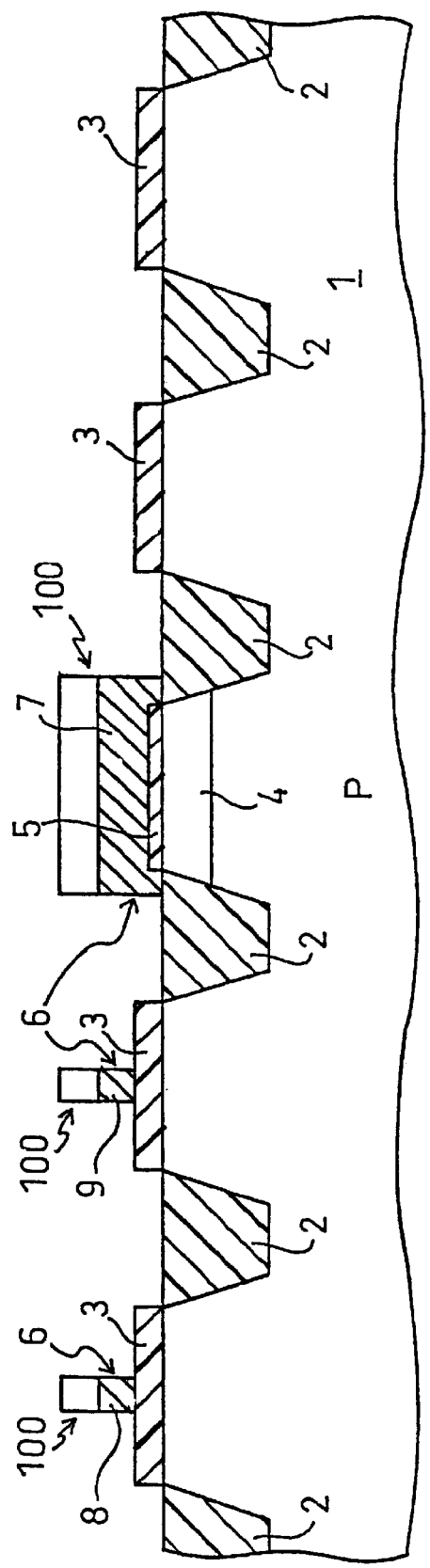

Still with reference to FIG. 3, a first polysilicon layer 6 is then deposited on the surface of the chip. With reference to FIG. 4, a photolithographic mask 100 is then applied to the chip and the first polysilicon layer 6 is selectively etched and removed to define floating gates 7 for the memory cells. At the same time, gate electrodes 8, 9 for the high-voltage transistors are defined in the first polysilicon layer 6. It should be noted that the mask 100 has a layout such that the first polysilicon layer 6 is also completely removed from the regions of the substrate 1 in which the low-voltage transistors of the high-performance logic circuitry are to be formed.

After the mask 100 has been removed, a mask 10 is then applied and an N-type dopant, typically phosphorus, is selectively implanted, with a dose of about $1–5 \times 10^{12}$ atoms/cm$^2$, and is diffused to form N-type wells 11 for containing P-channel high-voltage transistors (FIG. 5). If necessary and desired, a further implantation may be performed in the N-type wells 11 for the adjustment of the threshold voltages of the P-channel high-voltage transistors. These implantations must be performed with sufficiently high energy for the dopants to penetrate beneath the oxide layer 3 and the polysilicon gate 8. Suitable implantation energies are, for example, 150 to 250 kV and 250 to 400 kV.

A P-type dopant, typically BF$_2$, is implanted in the N-type wells 11 using the same mask 10, for example, with a dose of about $1 \times 10^{13}$ to $1 \times 10^{14}$ atoms/cm$^2$. The dopant is diffused to form relatively lightly doped source and drain regions 12, 13 disposed beside the gate electrode 8 for the P-channel high-voltage transistors. These relatively lightly doped regions 12, 13 form weakly doped portions of source and drain regions known as lightly doped drain (LDD) regions of the P-channel high-voltage transistors. This implantation is performed at a lower energy than the previous implantations, so that the P-type dopant does not penetrate beneath the gate electrode 8. A suitable energy is, for example, between 30 and 70 kV. After these steps, the structure is as shown in FIG. 5. The mask 10 is then removed.

A similar method is followed for the N-channel high-voltage transistors. A mask 14 similar to the mask 10 is applied to the chip. The mask 14 covers the regions of the chip in which the P-channel high-voltage transistors, the memory cells, and low-voltage transistors of the high-performance logic circuitry are to be integrated. With the use of the mask 14, a P-type dopant, for example, boron, is then selectively implanted and diffused in the substrate 1 to form P-type wells 15 which are to contain the N-channel high-voltage transistors. A suitable implantation dose is, for example, $1 \times 10^{12}$ to $1 \times 10^{13}$ atoms/cm$^2$. Suitable implantation energies are between 150 and 300 kV, enabling the dopant to penetrate the gate oxide 3 and the polysilicon gate 9.

An N-type dopant, for example, phosphorus, is implanted using the same mask 14 and is diffused into the P-type wells 15 to form relatively lightly doped N-type source and drain regions 16, 17 for the N-channel high-voltage transistors. These regions 16 and 17 will form the LDD regions for the N-channel high-voltage transistors. The implantation dose is preferably between $1 \times 10^{13}$ and $1 \times 10^{14}$ atoms/cm$^2$ and the implantation energy is preferably between 50 and 100 kV, which is quite low to prevent the dopant from penetrating beneath the polysilicon gate 9. After these steps, the structure is that shown in FIG. 6. The mask 14 is then removed.

At this point, the specific heat treatments required for the integration of the memory cells and of the high-voltage transistors are completed. N-type and P-type wells are then formed for housing the low-voltage transistors of the high-performance logic circuitry. For this purpose, a mask 20 is applied to the chip. The mask 20 covers the regions of the chip which are dedicated to the memory cells and to the high-voltage transistors, as well as the regions of the chip which are dedicated to the integration of the N-channel low-voltage transistors for the high-performance logic circuitry.

The mask 20 leaves uncovered the regions of the chip which are dedicated to the P-channel low-voltage transistors of the high-performance logic circuitry. With the use of the mask 20, an N-type dopant, for example, phosphorus, is implanted and diffused in the substrate 1 to form an N-type well 21 for containing the low-voltage P-channel transistors. Suitable implantation doses are, for example, on the order of $1 \times 10^{12}$ to $1 \times 10^{13}$ atoms/cm$^2$ and suitable implantation energies are between 50 and 500 kV. After these steps, the structure is as shown in FIG. 7.

The mask 20 is then removed and a mask 22 complementary to the mask 20 is applied to the chip and covers the regions of the chip which are dedicated to the memory cells, to the high-voltage transistors, and to the P-channel low-voltage transistors, leaving the regions of the chip which are dedicated to the N-channel low-voltage transistors uncovered.

A P-type dopant, for example, boron, is implanted and is diffused into the substrate 1 to form P-type wells 23 for containing the low-voltage N-channel transistors of the high-performance logic circuitry. Suitable implantation doses are, for example, on the order of $1 \times 10^{12}$ to $1 \times 10^{13}$ atoms/cm$^2$ with implantation energies between 30 and 300 kV. The structure shown in FIG. 8 is produced.

After the mask 22 has been removed from the chip, a dielectric layer 18 is deposited on the surface thereof, as shown in FIG. 9. The dielectric layer 18 is the interpolysilicon or interpoly dielectric layer which, in non-volatile memories with cells formed by floating-gate MOS transistors, separates the floating gates of the memory cells. These floating gates are formed by the first polysilicon layer, and the control gates of the memory cells are formed from a second polysilicon layer. Conventionally, the interpolysilicon dielectric layer 18 is preferably a triple oxide-nitride-oxide (ONO) layer. It should be noted that this step of the method has a negligible heat balance.

After the interpolysilicon dielectric layer 18 has been deposited, a mask is applied to the chip and is used for a subsequent selective etching. In conventional methods for the manufacture of non-volatile memories with memory cells formed by floating-gate MOS transistors, this mask serves for the selective removal of the interpoly dielectric, except for the region of the chip which is to house the matrix of memory cells. This later region is precisely where the interpoly dielectric is required to separate the floating gates of the memory cells from their control gates. For this reason, this mask is sometimes called the matrix mask.

Figure 16:
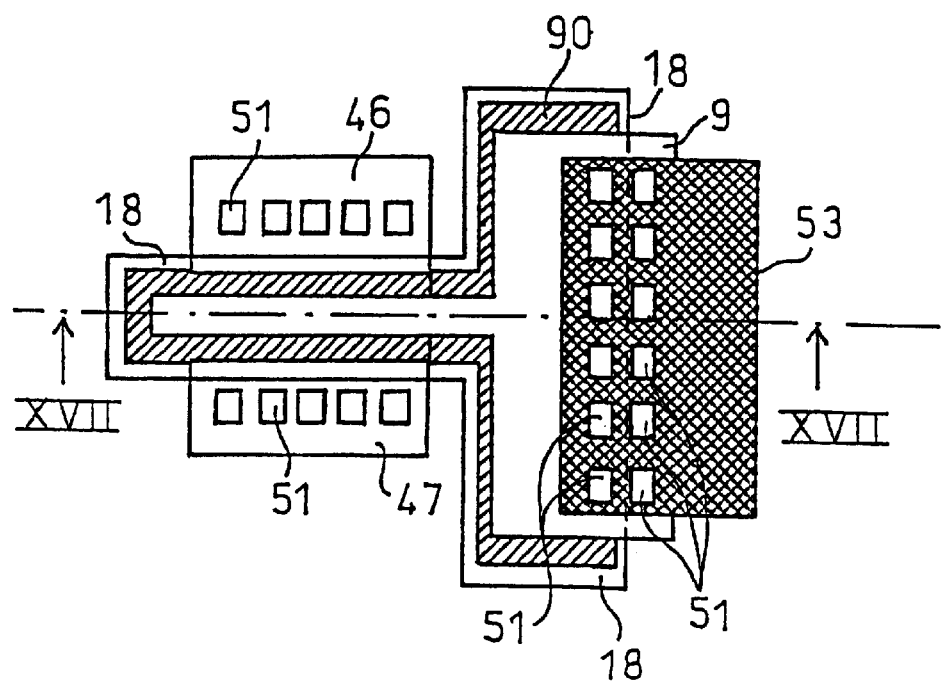
FIG. 16 is a top view of a high-voltage transistor according to the present invention.
Figure 17:
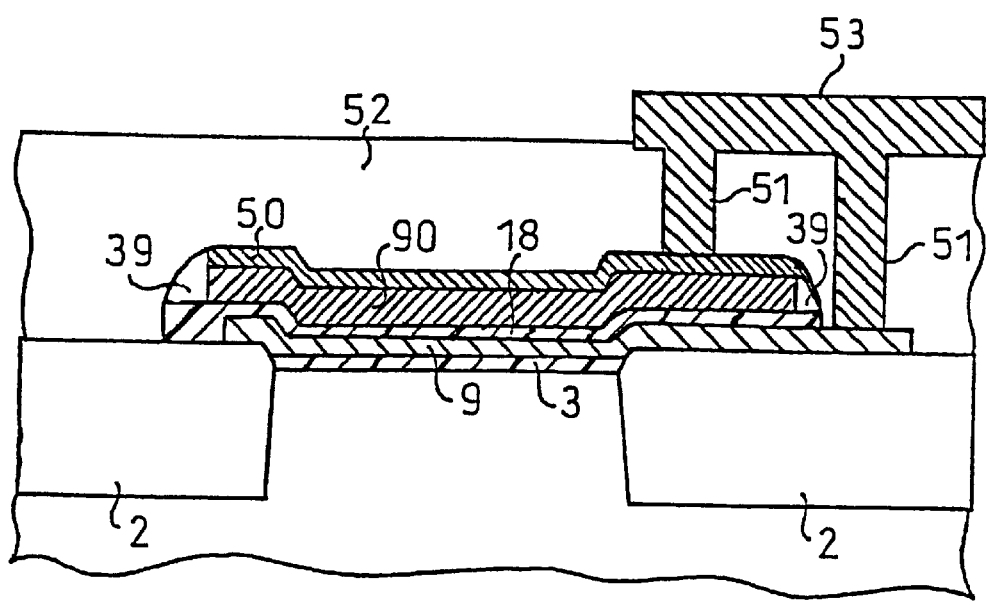
FIG. 17 is a cross-sectional side view of the high-voltage transistor illustrated in FIG. 16 viewed along the line 17—17.

In contrast with conventional methods for the manufacture of non-volatile memories, in the method according to the present invention the geometry or layout of the matrix mask is modified so that the matrix mask covers the area of the chip which is to house the matrix of memory cells. This is like conventional methods, but on the region of the chip which is to house the high-voltage transistors, the matrix mask is shaped in a manner such that, during the selective etching, the interpoly dielectric layer 18 is also left over the polysilicon gates 8, 9 of the high-voltage transistors, as well as in the region of the memory matrix. However, portions of the first polysilicon layer which are subsequently to be contacted (for example, portions of the gates 8, 9 of the high-voltage transistors, as shown in FIGS. 16 and 17), as well as the source and drain junctions 12, 13, 16, 17 of the transistors, are left free of the interpolysilicon dielectric layer 18.

Still according to the present invention, during the etching of the interpolysilicon dielectric layer 18, the oxide residues 3 which remained in the regions of the chip dedicated to the low-voltage transistors of the high-performance logic circuitry up to this point are also etched and removed. Upon completion of the etching of the interpolysilicon dielectric layer 18 and of the oxide residues 3, the matrix mask is removed and the structure is as shown in FIG. 10.

The removal of the interpolysilicon dielectric from the regions to be contacted is essential for the subsequent formation of so-called borderless contacts. That is, contacts formed that are self-aligned with the insulation oxide regions by means of etching, which is highly selective with respect to the silicon oxide present in the insulation regions 2.

Figure 11:
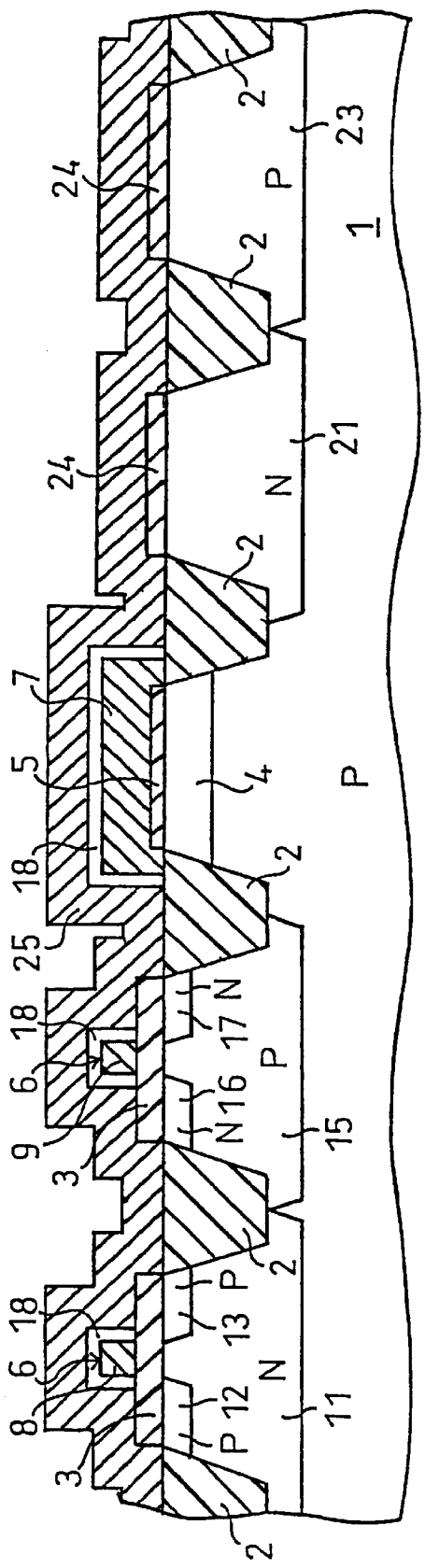

A silicon oxide layer 24 with a thickness less than that of the oxide layer 3, and preferably 20 to 80 angstroms, is grown on the surface of the substrate 1 in the regions of the chip which are dedicated to the low voltage transistors of the high-performance circuitry, and hence on the N-type wells 21 and the P-type wells 23. A second polysilicon layer 25 is then deposited on the entire chip producing the structure shown in FIG. 11.

At this point, the last steps specific to the memory cells are performed. Self-aligned selective etching of the second polysilicon layer 25, of the interpolysilicon dielectric layer 18, and of the first polysilicon layer 6 is then performed in the region of the memory matrix using a mask 28 which is already provided for in the course of a conventional method of manufacturing a non-volatile memory. The mask 28 also covers the regions of the chip which are dedicated to the high-voltage transistors and to the low-voltage transistors, as well as portions of the region dedicated to the memory matrix in which the cells are to be formed.

Figure 12:
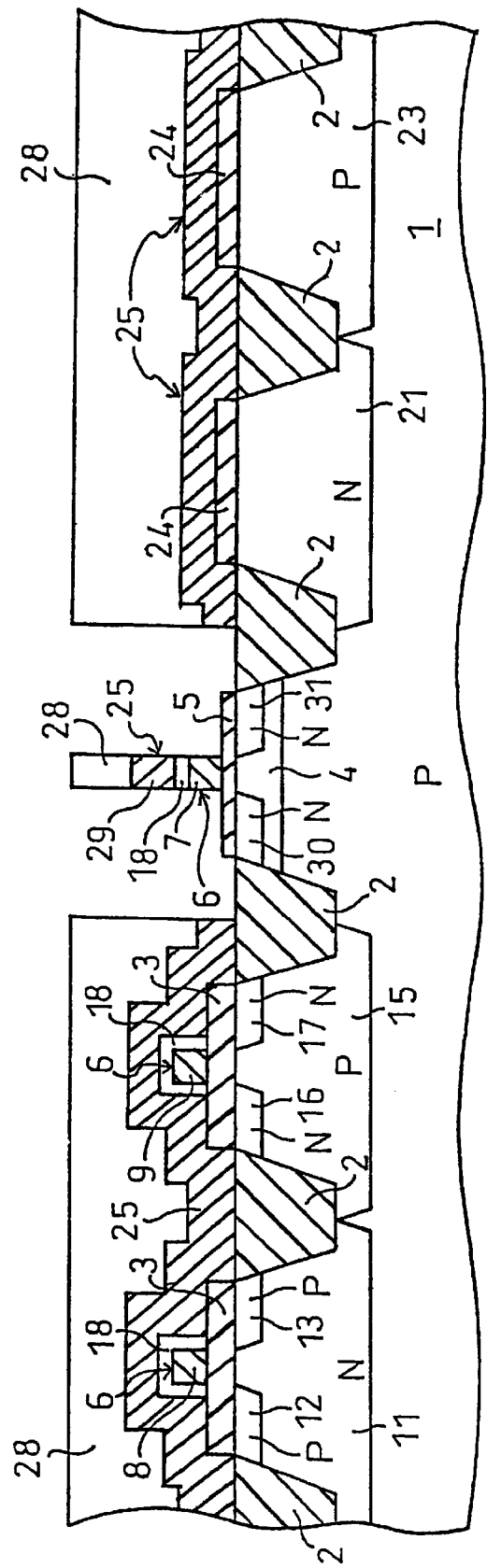
Figure 13:
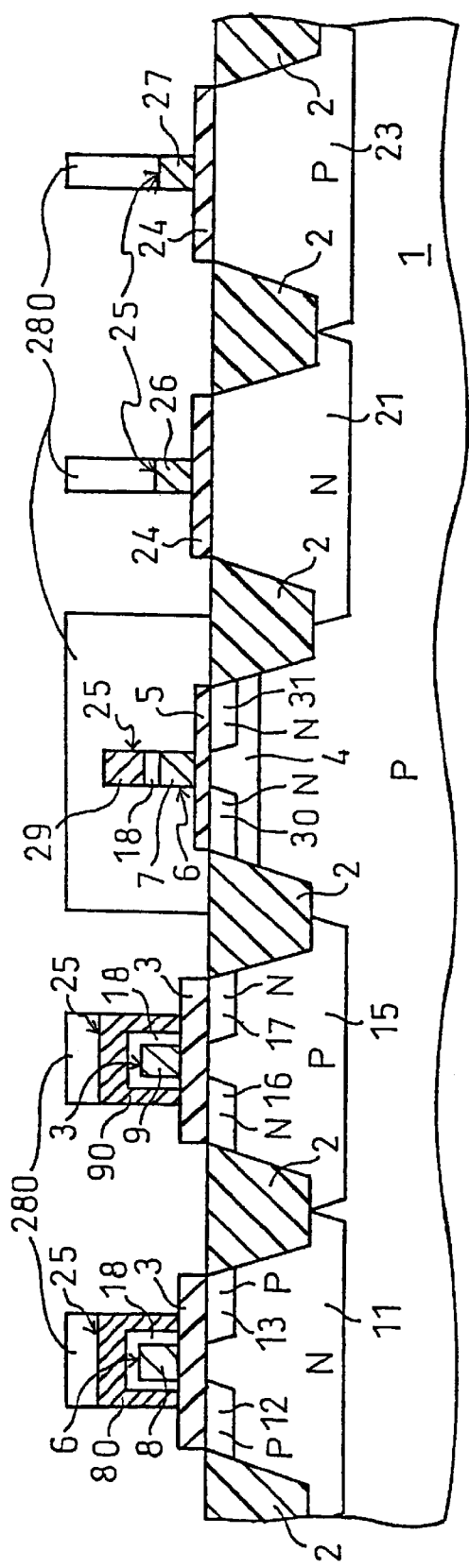
Figure 14:
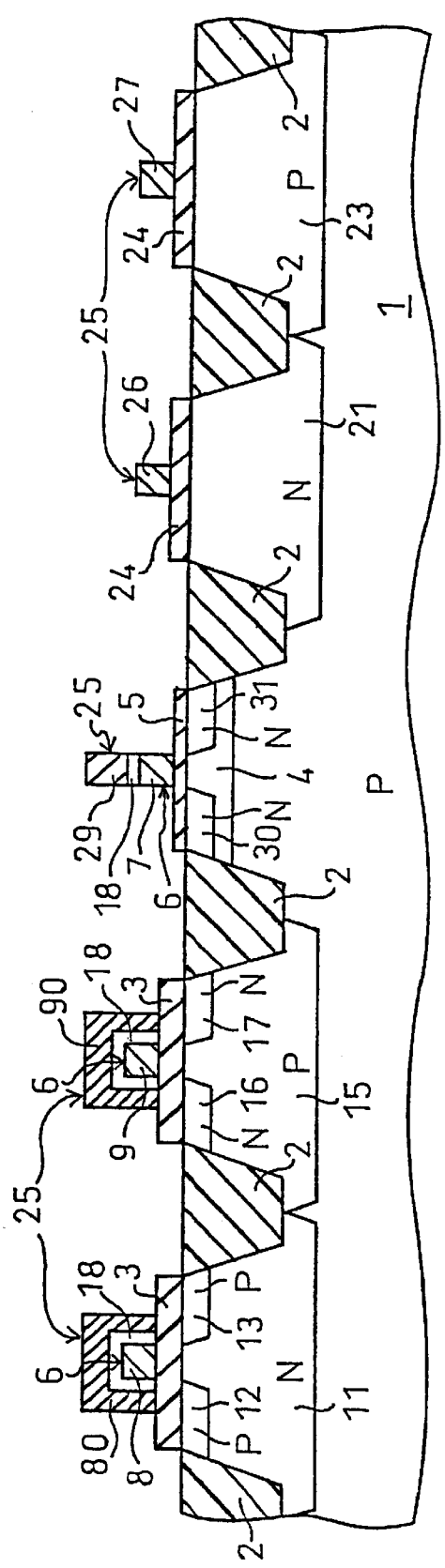

The floating gates 7 and the control gates 29 of the memory cells are thus fully defined. After the stacked gate structure of the memory cells has been fully defined, an N-type dopant, for example, arsenic, is implanted and diffused with the use of the same mask 28 to form source and drain regions 30, 31 of the memory cells. Suitable implantation doses and energies are, for example, $1\times10^{15}$ to $1-5\times10^{15}$ atoms/cm$^2$ and 40 to 100 kV. After these steps, the structure is as shown in FIG. 12. The structure of the memory cells is thus completed.

The mask 28 is then removed and a different mask 280 is applied to the chip for subsequent selective etching of the second polysilicon level 25 in the regions of the chip which are dedicated to the low-voltage transistors of the high-performance circuitry, to define the gates 26, 27 of the P-channel and N-channel low-voltage transistors of the logic circuitry. Covers 80, 90 which cover the gates 8, 9 of the high-voltage transistors are also defined in the second polysilicon level 25 using the same mask and the same etching process.

The fact that the second polysilicon layer is left over the high-voltage transistors prevents floating polysilicon spacers from forming at the sides of the gates. As shown in FIGS. 16 and 17, as far as the high-voltage transistors are concerned, the layout of the mask 280 is such that the covers 80, 90 defined in the second polysilicon layer 25 are disposed inside the portion of the interpolysilicon dielectric layer 18 which covers the gates 8, 9 of these transistors.

Figure 15:
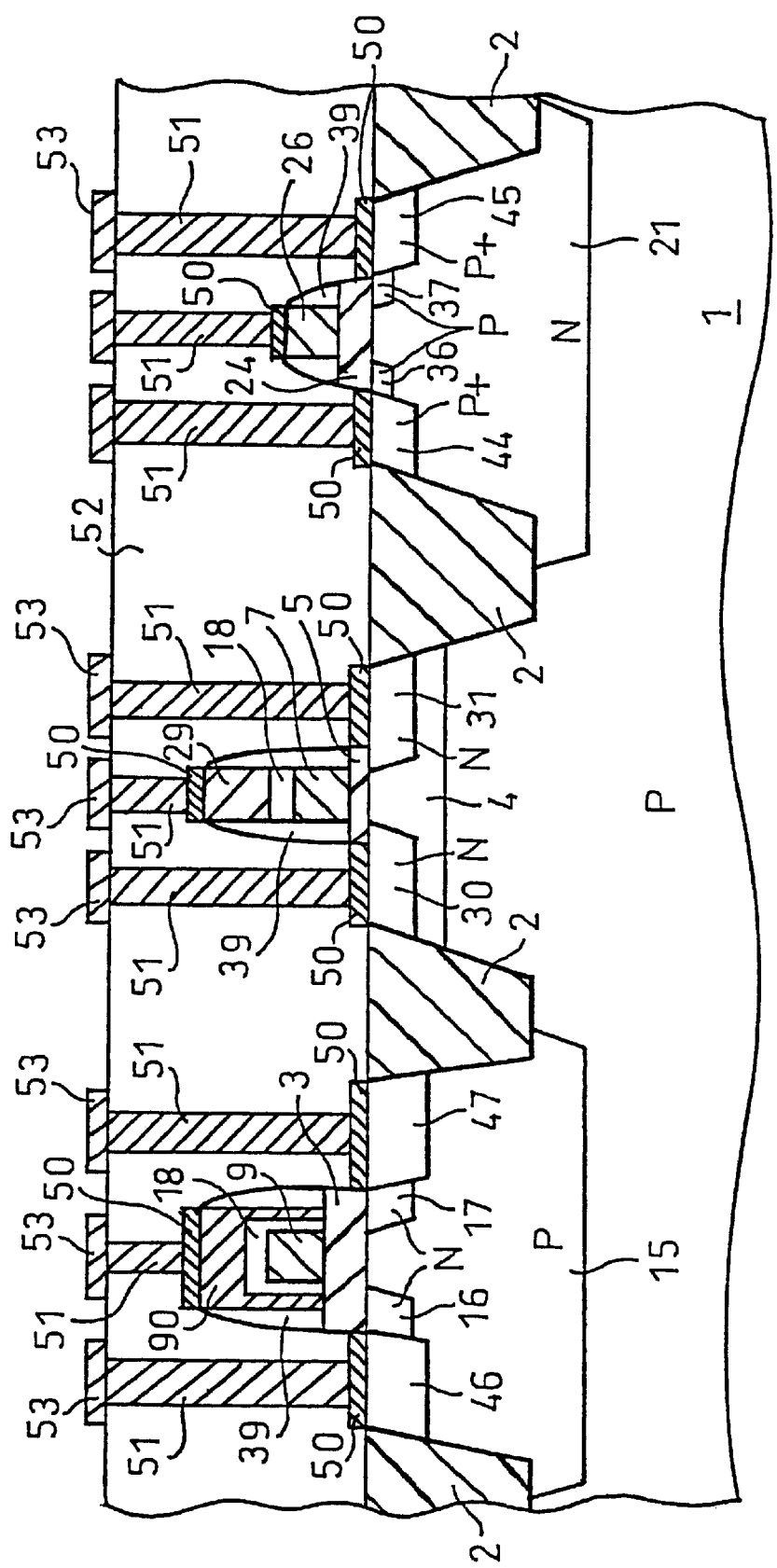
FIG. 15 is a cross-section view showing the structure of the preceding drawings, on a slightly enlarged scale, upon completion of the method of manufacturing according to the present invention.

Conventional method steps then follow for forming lightly doped portions of source and drain regions (LDDs) for the N-channel and P-channel low-voltage transistors of the high-performance logic circuitry, such as, for example, the regions 36, 37 shown in FIG. 15. Spacers 39 in FIG. 15 are then formed in a known manner at the sides of the gates of the memory cells and of both high-voltage and low-voltage transistors.

After the spacers have been formed, more heavily doped portions of source and drain regions are formed for the high-voltage and low-voltage transistors, for example, the regions 44, 45 and 46, 47 of FIG. 15. A silicidation process is then preferably performed, both on the source and the drain regions of the transistors and on their gates, forming silicide regions. A dielectric layer is then deposited, and vias are opened therein for contact with the gates and with the source and drain regions of the high-voltage and low-voltage transistors, as well as with the gates and the source and drain regions of the cells.

FIG. 15 shows, on a slightly enlarged scale in comparison with the previous drawings, the N-channel high-voltage transistor, the memory cell, and the P-channel low-voltage transistor upon completion of the manufacturing process, as well as the elements already described. Silicide regions 50 are also visible which are formed over the heavily doped source and drain portions 46, 47, 44, 45 of the high-voltage and low-voltage transistors and over the source and drain regions 30, 31 of the memory cells, as well as over the gate electrodes. Contact vias 51 formed in a dielectric layer 52 allow metallization lines 53 to contact the source and drain regions and the gate electrodes of the transistors and of the memory cells.

FIG. 16 is a schematic plan view of a high-voltage transistor and FIG. 17 is a view sectioned in the plane indicated by the line XVII—XVII of FIG. 16. It should be noted that the portion of the interpolysilicon dielectric layer 18 which covers the first poly gate 9 of the transistor extends in a manner such that the second poly cover 90 is completely within the interpolysilicon dielectric portion 18. The latter terminates substantially in a position between the row of contacts 51 which contact the second poly cover 90 and the row of contacts 51 which, on the other hand, contact the underlying first poly gate 9.

By virtue of the presence of the polysilicon covers 80, 90 over the gates 8, 9 of the high-voltage transistors, it is not necessary to provide a specific mask for protecting the portions of the relatively lightly doped source and drain regions 12, 13 during the implantation of dopants in relatively high doses to form the regions 46, 47. The covers 80, 90 in fact perform this function. The covers 80, 90 also perform the function of preventing the relatively lightly doped source and drain portions from being silicided, which normally requires the application of a specific mask.

An advantageous aspect of the present invention includes the use of the same polysilicon layer, i.e., the first polysilicon layer, for forming both the floating gates of the memory cells and the gate electrodes of the high-voltage transistors, within the context of a method of manufacture for integrating a memory device and high-performance, low-voltage circuitry in the same chip. This type of approach enables the source and drain implantations for the high-voltage transistors to be separated completely from the source and drain implantations for the low-voltage transistors.

The method according to the present invention enables the steps of the method which are necessary for the production of a programmable, non-volatile memory to be incorporated in a method for the manufacture of advanced, high-performance logic circuitry with the use of a minimal number of masks in addition to those required to manufacture the logic circuitry.

In the embodiment described, which relates to a high-density memory, there are six masks in addition to those provided for in a method for high-performance logic circuitry. More precisely, they are as follows: 1) the mask for forming the tunnel oxide of the memory cells, 2) the mask for defining the first polysilicon level, 3) the mask for forming the N-type wells for the P-channel high-voltage transistors, 4) the mask for forming the P-type wells for the N-channel high-voltage transistors, 5) the matrix mask for the self-aligned etching of the second polysilicon level and of the interpoly dielectric layer in the matrix area, and 6) the mask for the self-aligned etching of the second polysilicon level and of the interpolysilicon dielectric in the matrix.

With a further additional mask, it is possible to form buried wells within which to form the memory cells so as to enable the bodies of the memory cells to be polarized independently of the polarization of the substrate 1. In this case, the number of additional masks will be seven. With yet a further additional mask in addition to the six or seven masks mentioned, it is also possible to integrate an even higher-density memory. For this purpose, it suffices to provide a mask for the production of a memory matrix with self-aligned sources.

If memory cells of another type are to be integrated, the number of additional masks may even be fewer than in the embodiment described and may be reduced to five, for example, by doing without the mask for the self-aligned etching of the second polysilicon level and of the interpolysilicon dielectric in the area of the memory matrix.

By virtue of the intrinsic modularity of the method according to the invention, the performance of the transistors of the low-voltage logic circuitry is not altered by the introduction of specific steps for integrating the memory cells and the respective high-voltage transistors in the course of the method. The impact on the low-voltage transistors is minimal since the steps of the method which are necessary to produce the memory cells are concentrated at the beginning.

That which is claimed is:

1. An integrated circuit comprising:
   a semiconductor substrate;
   a logic circuit on said semiconductor substrate and comprising
      a plurality of first transistors on first portions of said semiconductor substrate operating at a first voltage and each comprising a first gate oxide layer, a gate electrode on said first gate oxide layer, a first portion of a first dielectric layer covering said gate electrode, and a conducting layer covering said first dielectric layer, and
      a plurality of second transistors on second portions of said semiconductor substrate operating at a second voltage less than the first voltage and each comprising a third gate oxide layer, and a gate electrode on said third gate oxide layer; and
   a memory device on said semiconductor substrate and comprising
      a plurality of memory cells on third portions of said semiconductor substrate and each comprising a second gate oxide layer, a floating gate on said second gate oxide layer, a second portion of said first dielectric layer on said floating gate, and a control gate on the second portion of said first dielectric layer.

2. An integrated circuit according to claim 1, wherein said first gate oxide has a first thickness, second gate oxide has a second thickness, and said third gate oxide has a third thickness less than the first thickness.

3. An integrated circuit according to claim 1, wherein said first gate oxide layer has a thickness in a range of about 100 to 300 angstroms, said second gate oxide layer has a thickness in a range of about of about 70 to 110 angstroms, and said third gate oxide layer has a thickness in a range of about 20 to 80 angstroms.

4. An integrated circuit according to claim 1, further comprising:
   a well of a first conductivity type in the first portions of said semiconductor substrate; and
   a well of a second conductivity type in the first portions of said semiconductor substrate.

5. An integrated circuit according to claim 1, further comprising:
   a well of a first conductivity type in the second portions of said semiconductor substrate; and
   a well of a second conductivity type in the second portions of said semiconductor substrate.

6. An integrated circuit according to claim 1, wherein said memory device comprises an EEPROM device and said logic circuit comprises a CMOS logic circuit.

7. An integrated circuit according to claim 1, wherein said plurality of first transistors comprises at least one N-channel transistor and at least one P-channel transistor, and said plurality of second transistors comprises at least one N-channel transistor and at least one P-channel transistor.

8. An integrated circuit comprising:
   a semiconductor substrate;
   a CMOS logic circuit on said semiconductor substrate and comprising
      a plurality of first transistors on first portions of said semiconductor substrate operating at a first voltage and each comprising a first gate oxide layer, a gate electrode on said first gate oxide layer, a first portion of a first dielectric layer covering said gate electrode, and a conducting layer covering said first dielectric layer, and
      a plurality of second transistors on second portions of said semiconductor substrate operating at a second voltage less than the first voltage and each comprising a third gate oxide layer, and a gate electrode on said third gate oxide layer; and
   an EEPROM device on said semiconductor substrate and comprising
      a plurality of memory cells on third portions of said semiconductor substrate and each comprising a second gate oxide layer, a floating gate on said second gate oxide layer, a second portion of said first dielectric layer on said floating gate, and a control gate on the second portion of said first dielectric layer,
   said first gate oxide having a first thickness, second gate oxide having a second thickness, and said third gate oxide having a third thickness less than the first thickness.

9. An integrated circuit according to claim 8, wherein said first gate oxide layer has a thickness in a range of about 100 to 300 angstroms, said second gate oxide layer has a thickness in a range of about of about 70 to 110 angstroms, and said third gate oxide layer has a thickness in a range of about 20 to 80 angstroms.

10. An integrated circuit according to claim 9, further comprising:
    a well of a first conductivity type in the first portions of said semiconductor substrate; and
    a well of a second conductivity type in the first portions of said semiconductor substrate.

11. An integrated circuit according to claim 9, further comprising:
    a well of a first conductivity type in the second portions of said semiconductor substrate; and
    a well of a second conductivity type in the second portions of said semiconductor substrate.

* * * * *